United States Patent
Lin et al.

(10) Patent No.: US 8,970,029 B2
(45) Date of Patent: Mar. 3, 2015

(54) THERMALLY ENHANCED HEAT SPREADER FOR FLIP CHIP PACKAGING

(75) Inventors: Po-Yao Lin, Zhudong Township (TW); Wen-Yi Lin, Wugu Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 193 days.

(21) Appl. No.: 12/782,814

(22) Filed: May 19, 2010

(65) Prior Publication Data

US 2011/0024892 A1   Feb. 3, 2011

Related U.S. Application Data

(60) Provisional application No. 61/229,958, filed on Jul. 30, 2009.

(51) Int. Cl.
| | | |
|---|---|---|
| *H01L 23/34* | (2006.01) | |
| *H01L 23/12* | (2006.01) | |
| *H01L 23/10* | (2006.01) | |
| *H01L 23/04* | (2006.01) | |
| *H01L 23/427* | (2006.01) | |

(Continued)

(52) U.S. Cl.
CPC .............. *H01L 23/04* (2013.01); *H01L 23/427* (2013.01); *H01L 24/16* (2013.01); *H01L 24/32* (2013.01); *H01L 24/73* (2013.01); *H01L 2224/16* (2013.01); *H01L 2224/291* (2013.01); *H01L 2224/29109* (2013.01); *H01L 2224/2929* (2013.01); *H01L 2224/29339* (2013.01); *H01L 2224/73204* (2013.01); *H01L 2224/73253* (2013.01); *H01L 2924/16152* (2013.01); *H01L 2924/01019* (2013.01); *H01L 2224/16225* (2013.01); *H01L 2224/32225* (2013.01)
USPC ........... 257/719; 257/704; 257/706; 257/707; 257/712; 257/716; 257/718; 257/732; 165/80.4; 165/104.21; 361/70

(58) Field of Classification Search
None
See application file for complete search history.

(56) References Cited

U.S. PATENT DOCUMENTS

| | | | |
|---|---|---|---|
| 4,914,551 A | | 4/1990 | Anschel et al. |
| 5,949,137 A | * | 9/1999 | Domadia et al. ............... 257/712 |

(Continued)

FOREIGN PATENT DOCUMENTS

| | | |
|---|---|---|
| CN | 100517666 | 7/2009 |
| TW | 200633171 | 9/2006 |
| TW | 200724017 | 6/2007 |

OTHER PUBLICATIONS

Office Action dated Apr. 29, 2013 from corresponding application No. TW 099125308.

*Primary Examiner* — Michael Jung
(74) *Attorney, Agent, or Firm* — Lowe Hauptman & Ham, LLP

(57) ABSTRACT

A flip chip microelectronic package having a heat spreader is provided. In one embodiment, the microelectronic package comprises a die having a first surface and a second surface, the first surface being coupled to a substrate; a thermal interface material disposed in thermal conductive contact with the second surface of the die; and a heat spreader adapted for dissipating heat from the die, the heat spreader disposed in thermal conductive contact with the thermal interface material. The heat spreader includes a lid having an inner chamber therein defined by a first wall and a second wall, the second wall securely joined to the first wall to seal the chamber, the lid being mounted to the substrate and a wick layer positioned in the chamber.

20 Claims, 3 Drawing Sheets

(51) Int. Cl.
*F28F 7/00* (2006.01)
*F28D 15/00* (2006.01)
*H02H 3/00* (2006.01)
*H02H 7/26* (2006.01)
*H01L 23/00* (2006.01)

(56) References Cited

U.S. PATENT DOCUMENTS

| | | | |
|---|---|---|---|
| 6,008,536 | A | 12/1999 | Mertol |
| 6,188,578 | B1 | 2/2001 | Lin et al. |
| 6,212,074 | B1 * | 4/2001 | Gonsalves et al. ............ 361/717 |
| 6,437,437 | B1 * | 8/2002 | Zuo et al. ..................... 257/710 |
| 6,525,420 | B2 * | 2/2003 | Zuo et al. ..................... 257/715 |
| 6,665,187 | B1 * | 12/2003 | Alcoe et al. ................... 361/719 |
| 6,849,942 | B2 * | 2/2005 | Lin et al. ...................... 257/712 |
| 7,002,246 | B2 * | 2/2006 | Ho et al. ....................... 257/707 |
| 7,193,851 | B2 * | 3/2007 | Yatskov ........................ 361/710 |
| 7,301,227 | B1 | 11/2007 | Gektin et al. |
| 2002/0056908 | A1 * | 5/2002 | Brownell et al. ............. 257/714 |
| 2005/0001311 | A1 | 1/2005 | Ho et al. |
| 2005/0201060 | A1 * | 9/2005 | Huang .......................... 361/700 |
| 2006/0060952 | A1 * | 3/2006 | Yuan et al. .................... 257/675 |
| 2006/0261469 | A1 * | 11/2006 | Ni et al. ........................ 257/718 |
| 2007/0035937 | A1 * | 2/2007 | Colbert et al. ................ 361/810 |
| 2007/0267179 | A1 * | 11/2007 | Hou et al. ................. 165/104.26 |
| 2007/0269288 | A1 * | 11/2007 | Palm ............................. 411/386 |
| 2008/0237843 | A1 * | 10/2008 | Gupta et al. .................. 257/713 |
| 2009/0057928 | A1 * | 3/2009 | Zhai et al. .................... 257/789 |

\* cited by examiner

US 8,970,029 B2

THERMALLY ENHANCED HEAT SPREADER FOR FLIP CHIP PACKAGING

CROSS-REFERENCE TO RELATED APPLICATIONS

The present application claims priority of U.S. Provisional Patent Application Ser. No. 61/229,958, filed on Jul. 30, 2009, which is incorporated herein by reference in its entirety.

TECHNICAL FIELD

The present disclosure relates generally to a heat spreader, and more particularly, to a thermally enhanced heat spreader for flip chip packaging.

BACKGROUND

As packaging density of microelectronic devices increases with technology developments, manufacturers are continually shrinking the sizes of microelectronic devices to satisfy increasing demand for smaller electronic devices. Another trend in modern microelectronic devices is the increasing use of higher power consumption circuits, such as in a modern CPU chip. In order to accommodate the more densely packaged and the higher power consumption microelectronic devices, the heat dissipation property of a conventional flip chip package (e.g., ball grid array and land grid array) needs be improved.

A heat sink, sometimes called a heat spreader, normally made of a higher thermal conductivity material such as copper has been used to fulfill the need for improving heat dissipation in flip chip packages. Although copper, with its high thermal conductivity is a common solution for a lid of the heat spreader, there exists a coefficient of thermal expansion (CTE) mismatch between the copper lid and the low CTE ceramic substrate of the flip chip package. A CTE mismatch between these two materials induces a stress concentration on the adhesive region between the heat spreader lid and the ceramic substrate leading to a risk of delamination of the heat spreader lid from the substrate. To resolve the CTE mismatch problem, low CTE metal or metal/ceramic composite materials such as copper tungsten (CuW) or aluminum-silicon-carbide (AlSiC) have been proposed and used; however, the thermal performance of these materials is not as good as copper because they have comparatively low thermal conductivity.

The increased use of more densely packaged microelectronic devices, high powered CPUs that lead to localized areas on the chip having relatively high heat generation (e.g., "hot spots"), delicate extreme low k (ELK) dielectric layers, and lead free bumps, have all increased the risk of cracks in the dielectric layers and delamination between the heat spreader and the substrate. Accordingly, a heat spreader having not only enhanced thermal dissipation but also one being able to resolve the CTE mismatch issue is becoming ever more crucial.

Upon reading the following detailed description, it will become more apparent that there is a need for a thermally enhanced heat spreader in advanced IC packaging such as flip chip that avoids the delamination and CTE mismatch concerns associated with conventional heat spreaders.

BRIEF DESCRIPTION OF DRAWINGS

The features, aspects, and advantages of the disclosure will become more fully apparent from the following detailed description, appended claims, and accompanying drawings in which:

DETAILED DESCRIPTION

In the following description, numerous specific details are set forth to provide a thorough understanding of embodiments of the present invention. However, one having an ordinary skill in the art will recognize that embodiments of the invention can be practiced without these specific details. In some instances, well-known structures and processes have not been described in detail to avoid unnecessarily obscuring embodiments of the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
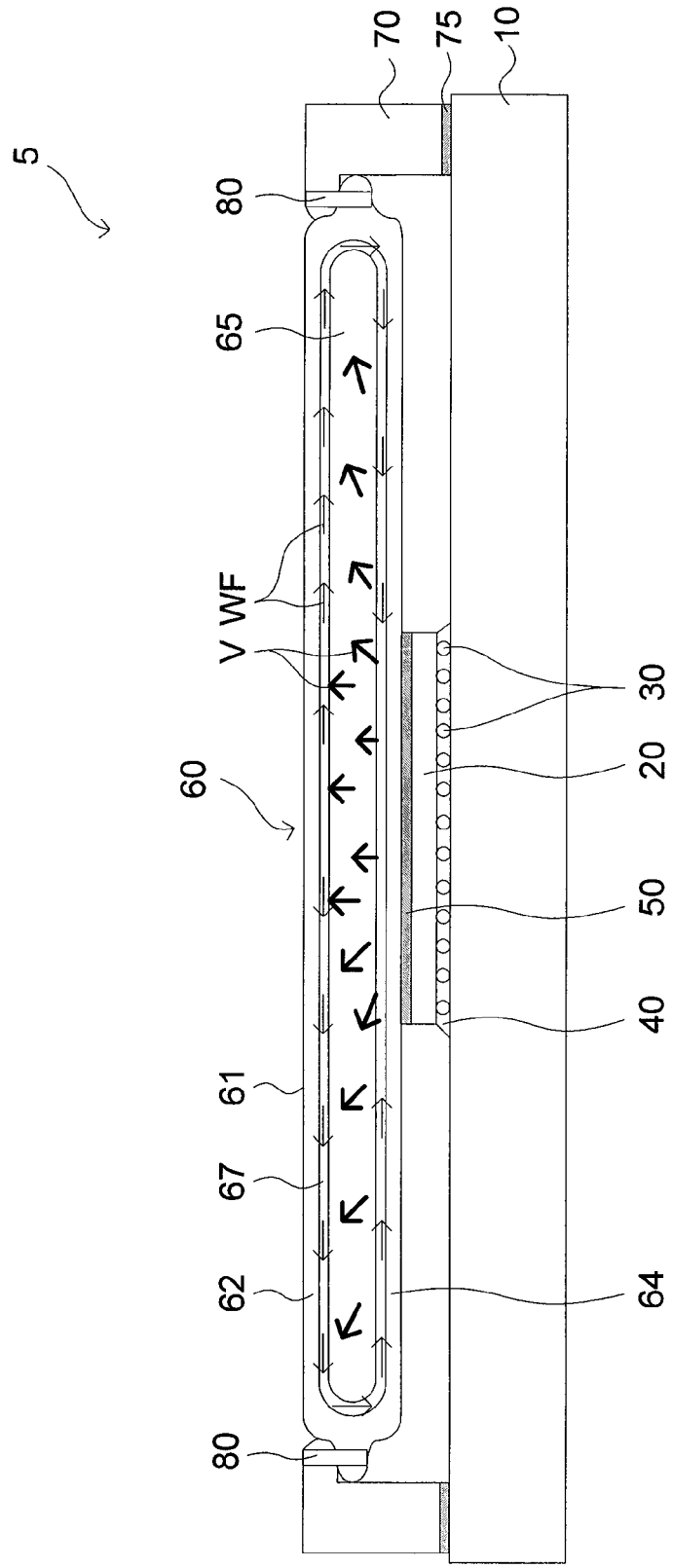
FIG. 1 is a cross-sectional view of a microelectronic package having a heat spreader according to one embodiment of the present invention.

FIG. 1 is a cross-sectional view of a microelectronic package 5 having a heat spreader according to one embodiment of the present invention. The microelectronic package 5 may include a die 20 having a first surface containing a plurality of electrical contacts in electrical communication with active circuitry for an intended application, and a second surface generally opposed to the first surface. The first surface of the die 20 may be mounted in electrical coupling with a carrier substrate 10 using joining members, such as copper pillars or solder bumps 30, by flip chip mounting the first surface of the die 20 with the substrate 10. Suitable materials for the substrate 10 include, but are not limited to, epoxy resin bonded glass fabric and an organic substrate (e.g., comprising a core layer of glass epoxy or glass-polyimide-based copper trace and resin). An underfill material 40, such as epoxy resin, may be filled and sealed in the gap between the die 20 and the substrate 10 thereby encapsulating the solder bumps 30. The underfill material 40 provides mechanical support, electrical isolation of the joining members (e.g., solder bumps), and protection of the active circuitry from the environment. Although not shown, the substrate 10 may also electrically couple the die 20 to an external circuit or printed circuit board by solder balls, or through sockets, or by other interconnect schemes.

The microelectronic package 5 may also comprise a thermal interface material (TIM) 50 that is disposed in thermal conductive contact with the second surface of the die 20. A heat spreader 60 may be disposed in thermal conductive contact with the thermal interface material 50. Providing a thermal interface material 50 as an interface between the die 20 and the heat spreader 60 is advantageous in various aspects, including but not limited to, improved thermal conductivity of the finished microelectronic package 5 and reduced risk of die damage. Because surfaces of the die 20 and the heat spreader 60 are uneven, juxtaposing the heat spreader 60 directly to the die 20 would result in increased thermal resistance of the composite assembly. Interposing a suitable thermal interface material 50 therebetween evens out contact surfaces of the heat spreader 60 and the die 20 to improve thermal conductivity. Also, die damage may arise due to variations in the thickness of the heat spreader 60 and the die 20, and in some situations, resulting in excessive pressure on the die 20 by the heat spreader 60. Providing a thermal interface material 50 between the heat spreader 60 and the die 20 therefore alleviates pressure exerted by the heat spreader 60 on the die 20. Suitable thermal interface material 50 should have high thermal conductivity and should improve thermal contact when disposed between the heat spreader 60 and the die 20. Examples of suitable thermal interface material 50 include, but are not limited to, thermal greases, such as silver filled epoxy or the like, polymer-solder hybrid thermal interface material, and indium foil. The thickness of the thermal interface material 50 will vary depending upon the performance requirements of the die 20. In one embodiment, the thickness of the thermal interface material 50 varies from about 50 microns to about 100 microns.

Referring still to FIG. 1, the heat spreader 60 is disposed in thermal conductive contact with the thermal interface material 50. The heat spreader 60 includes a lid 61 having an inner vapor chamber 65 therein defined by an outer or top wall 62 and an inner or bottom wall 64, the bottom wall 64 attached to the top wall 62, along their common edges, to hermetically seal the chamber 65 at their joining interface. The vapor chamber 65 extends transversely and longitudinally throughout the lid 61, according to aspects of the present invention. In one embodiment of the present invention, the top wall 62 and the bottom wall 64 comprise substantially uniform thickness sheets of a thermally conductive material, and are spaced apart by about 0.5 mm to about 1 mm so as to form the void space or the vapor chamber 65 between them. In some embodiments, the depth and/or width of the vapor chamber 65 may vary, e.g., either narrowing or broadening in a particular direction.

A two-phase vaporizable liquid resides within the chamber 65, and serves as the working fluid, WF for the heat spreader 60. The working fluid, WF may comprise of freon, water, alcohol or a like liquid being capable of vaporizing and possessing a relatively high latent heat in order to disperse heat away from the die 20.

The lid 61 has a low coefficient of thermal expansion substantially similar to the low coefficient of thermal expansion of the carrier substrate 10. According to one embodiment of the present invention, the lid 61, including the top wall 62 and the bottom wall 64 is made of a material having a low coefficient of thermal expansion (CTE), such as copper, copper alloy, copper tungsten (CuW), or aluminum-silicon-carbide (AlSiC). Other suitable materials may also be used for the lid 61 so long as the material possesses at least a low coefficient of thermal expansion and high thermal conductivity. The thickness of the lid 61 depends on several factors including, but not limited to, heat dissipation rate of the die 20, thermal conductivity of the heat spreader material, presence of an external heat sink, required size of the finished microelectronic package 5, and surface area of the die 20.

The lid 61 is mounted to the substrate 10 by attachment frame 70, which serves to support lid 61 above substrate 10 and die 20. The height of the attachment frame 70 is selected such that a gap that exists between the interior surface of the lid 61. A top surface of the substrate 10 is sized to accept at least the die 20. To prevent delamination of the heat spreader 60 from the substrate 10, the attachment frame 70 has a low coefficient of thermal expansion substantially similar to the low coefficient of thermal expansion of the carrier substrate 10. According to one embodiment of the present invention, the attachment frame 70 comprises a material having a low coefficient of thermal expansion (CTE) such as for example, copper, copper alloy, copper tungsten (CuW), or aluminum-silicon-carbide (AlSiC). Other suitable materials may also be used for the attachment frame 70 so long as the material possesses at least a low coefficient of thermal expansion. The attachment frame 70 may be constructed in various ways, including, but not limited to the illustration shown in FIG. 1 and may be constructed in various forms or shapes, again not limited to what is depicted in FIG. 1.

The lid 61 is securely fastened to the attachment frame 70 by means of one or more securing devices 80. The securing devices 80 may include rivets, screws, solder, adhesives, or other means for securing the lid 61 to the attachment frame 70. The attachment frame 70 is mounted to the substrate by an adhesive 75.

Figure 2:
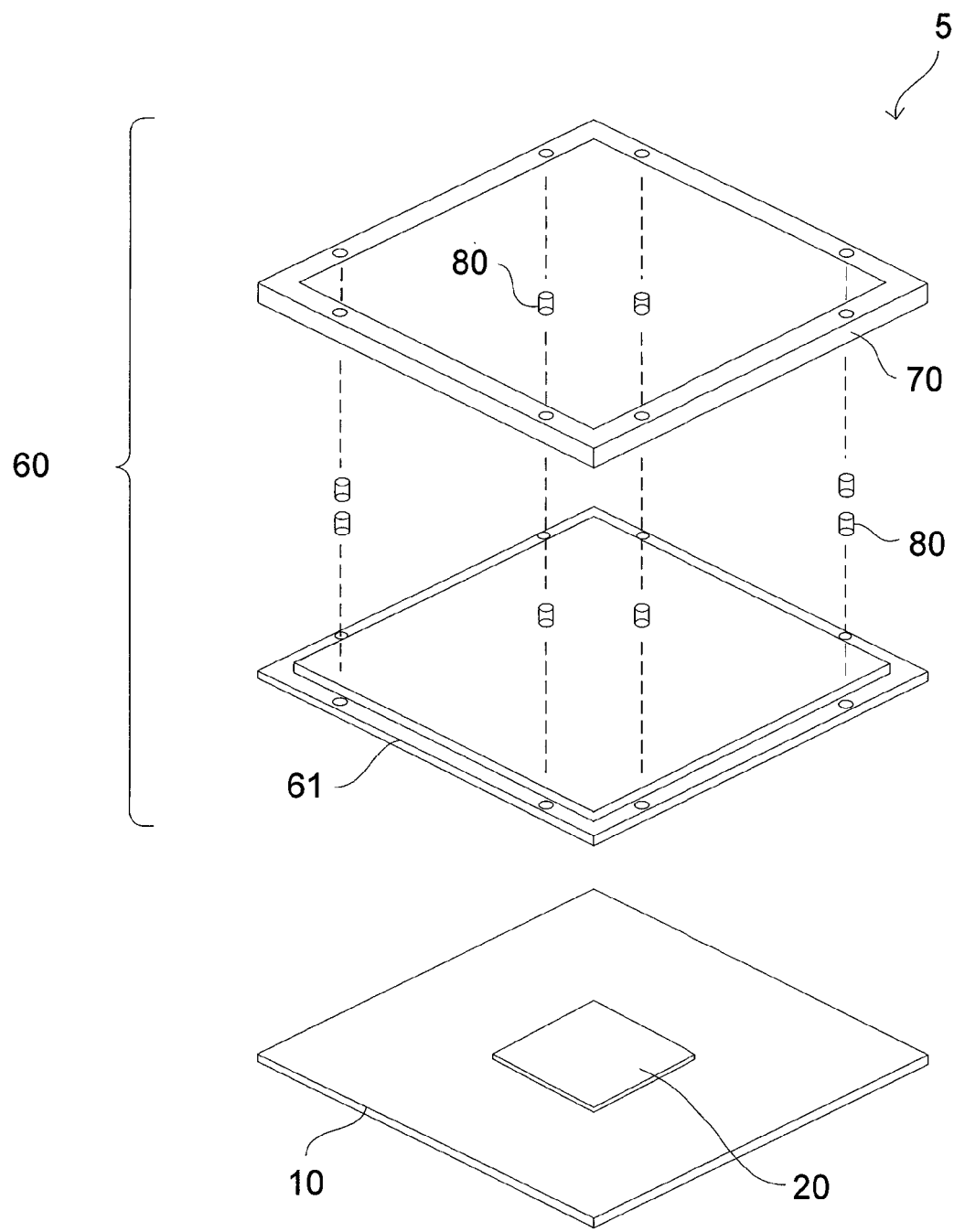
FIG. 2 is an expanded view of FIG. 1.

An expanded view of the microelectronic package 5 including heat spreader 60 is depicted in FIG. 2.

Figure 3:
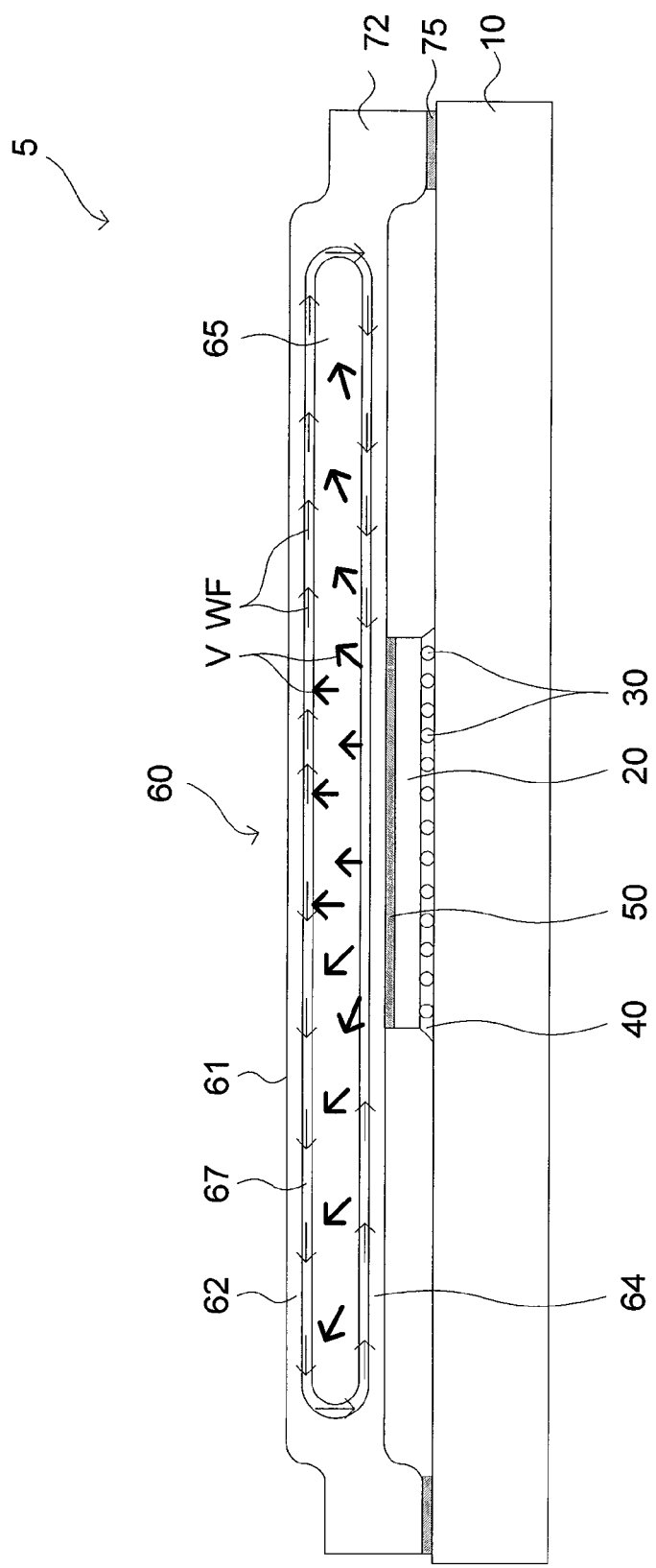
FIG. 3 is a cross-sectional view of a microelectronic package having a heat spreader according to another embodiment of the present invention.

FIG. 3 is a cross-sectional view of a microelectronic package 5 having a heat spreader 60, according to another embodiment of the present invention. Instead of having the attachment frame 70 fasten the lid 61 to the substrate 10, the lid 61 itself serves as the fastening mechanism, as well as the support for the lid 61 above substrate 10 and die 20. The lid 61 includes mounting flanges 72 that are formed along the peripheral edges or on all sides of the lid 61 for securing the lid 61 to the substrate. The mounting flanges 72 may be constructed in other forms or shapes, apart from what is illustrated in FIG. 3.

To prevent delamination of the heat spreader 60 from the substrate 10, the mounting flanges 72 have a low coefficient of thermal expansion substantially similar to the low coefficient of thermal expansion of the carrier substrate 10. According to one embodiment of the present invention, the mounting flanges 72 comprise a material having a low coefficient of thermal expansion (CTE) such as for example, copper, copper alloy, copper tungsten (CuW), aluminum-silicon-carbide (AlSiC), copper-silicon-carbide (CuSiC). Other suitable materials may also be used for the mounting flanges 72 so long as the material possesses at least a low coefficient of thermal expansion. The mounting flanges are secured to the substrate 10 by an adhesive 75.

As shown in FIGS. 1 and 2, a substantially planar wick layer 67 is positioned in the chamber 65, the wick layer 67 for receiving the working fluid, WF. According to one embodiment of the present invention, the wick layer 67 is positioned substantially along the inner or inside walls of the chamber 65. In some embodiments, the wick layer 67 is positioned substantially along the inner surfaces of the top wall 62 and the bottom wall 64 of the lid 61. The wick layer 67 is made by weaving metal wires that have a large amount of pores (not shown) therein, to generate capillary force for transferring the working fluid, WF. Alternatively, the wick layer 67 can also be made by other methods (e.g., sintering metal power). The wick layer may have an average thickness of about 0.1 mm to about 0.5 mm.

In operation, as the die 20 (or other electronic component) maintained in thermal contact with the heat spreader operates and generates heat, the working fluid, WF contained in the wick layer 67 corresponding to a hot contacting location is heated and vaporizes. The vapor, V then spreads to fill the vapor chamber 65, and wherever the vapor, V comes into contact with a cooler surface of the chamber 65, it releases its latent heat of vaporization and condenses to liquid. The condensate reflows to the hot contacting location via a capillary force generated by the wick layer 67. Thereafter, the condensate frequently vaporizes and condenses to form a circulation to thereby remove the heat generated by the die 20, or other electronic components. This arrangement effectively spreads thermal energy across the heat spreader 60 so that it may be drawn off and dissipated, e.g., by conventional finned heat sinks or heat pipes, attached to the top wall 62 of the lid 61.

Aspects of the heat spreader 60 of the present invention thus provides the flip chip microelectronic package 5 with enhanced ability to spread the heat generated by die 20 (or other electronic components) at hot spots on the device to a much larger surface area. It is understood that the heat spreader 60 may vary considerably from one design to another. It is also to be understood that the lid 61 of the heat spreader is not limited to any one lid configuration shown in the drawings.

The preceding disclosure was described with reference to exemplary embodiments of the present invention. It will, however, be evident that various modifications, structures, processes, and changes may be made thereto without departing from the broader spirit and scope of the embodiments of the present invention, as set forth in the claims. The specification and drawings are, accordingly, to be regarded as illustrative and not restrictive. It is understood that embodiments of the present invention are capable of using various other combinations and environments and are capable of changes or modifications within the scope of the inventive concept as expressed herein.

What is claimed is:

1. A microelectronic package, comprising:
   a die having a first surface and a second surface, the first surface coupled to a substrate;
   a thermal interface material disposed in thermal conductive contact with the second surface of the die; and
   a heat spreader configured to dissipate heat from the die, the heat spreader disposed in thermal conductive contact with the thermal interface material, the heat spreader comprising:
     a lid having an inner chamber therein defined by a first wall and a second wall, the second wall securely joined to the first wall to seal the inner chamber,
     a wick layer positioned in the inner chamber, and
     an attachment frame securing the lid to the substrate;
   wherein the attachment frame extends continuously for 360 degrees in a circumferential direction of the lid, and
   wherein the attachment frame has a first member and a second member transverse to the first member, the first member engaging the lid from above, a bottom surface of the second member secured to the top surface of the substrate, the attachment frame extending continuously from the first member to the second member.

2. The microelectronic package of claim 1, wherein the lid comprises copper, copper alloy, copper tungsten (CuW), or aluminum-silicon-carbide (AlSiC).

3. The microelectronic package of claim 1, further comprising:
   at least one securing device securing the lid to the attachment frame, wherein the at least one securing device is free of direct contact with the substrate.

4. A microelectronic package, comprising:
   a substrate;
   a die having a bottom surface and a top surface, the bottom surface bonded to a top surface of the substrate;
   a thermal interface material disposed on top and in thermal conductive contact with the top surface of the die; and
   a heat spreader configured to dissipate heat from the die, the heat spreader disposed on top and in thermal conductive communication with the thermal interface material, the heat spreader comprising:
     a lid having an inner chamber therein defined by a first wall and a second wall, the second wall securely joined to the first wall to seal the inner chamber;
     an attachment frame securing the lid to the substrate, and
     at least one securing device securing the lid to the attachment frame;
   wherein the attachment frame has a first member and a second member transverse to the first member, the first member engaging the lid from above, a bottom surface of the second member above and secured to the top surface of the substrate, the attachment frame extending continuously from the first member to the second member.

5. The microelectronic package of claim 4, further comprising:
   solder bumps coupling the die to the substrate.

6. The microelectronic package of claim 5, further comprising:
   an underfill material filling a gap between the die and the substrate, the underfill material encapsulating the solder bumps.

7. The microelectronic package of claim 4, wherein the first wall and the second wall of the lid comprise copper.

8. The microelectronic package of claim 7, wherein the attachment frame comprises copper tungsten (CuW) or aluminum-silicon-carbide (AlSiC).

9. The microelectronic package of claim 4, wherein the at least one securing device comprises rivets, screws, solder, or adhesives.

10. The microelectronic package of claim 4, further comprising:
    an adhesive positioned between and securing the bottom surface of the second member of the attachment frame and the top surface of the substrate.

11. The microelectronic package of claim 4, wherein the heat spreader further comprises a working fluid and a wick layer contained in the inner chamber, the wick layer configured to receive the working fluid and positioned along inner surfaces of the first wall and the second wall of the lid.

12. The microelectronic package of claim 11, wherein the working fluid comprises water, freon, or alcohol.

13. A microelectronic package, comprising:
    a substrate;
    a die having a bottom surface and a top surface, the bottom surface bonded to a top surface of the substrate;
    a thermal interface material disposed on top and in thermal conductive contact with the top surface of the die; and
    a heat spreader configured to dissipate heat from the die, the heat spreader disposed on top and in thermal conductive communication with the thermal interface material, the heat spreader comprising:
      a lid having an inner chamber therein defined by a first wall and a second wall, the second wall securely joined to the first wall to seal the inner chamber;
      an attachment frame securing the lid to the substrate, and
      at least one securing device securing the lid to the attachment frame;
    wherein the attachment frame has a first member and a second member transverse to the first member, the first member engaging the lid from above, a bottom surface of the second member secured to the top surface of the substrate, the attachment frame extending continuously from the first member to the second member, and
    wherein the attachment frame is a full ring having an L-shaped cross-section defined by the first and second members.

14. A method of forming microelectronic packages, comprising:
  coupling a die to a substrate;
  disposing a thermal interface material on a top surface of the die;
  disposing a heat spreader, which is configured to dissipate heat from the die, on top and in thermal conductive communication with the thermal interface material, the heat spreader comprising:
    a lid having an inner chamber therein defined by a first wall and a second wall, the second wall securely joined to the first wall to seal the inner chamber,
    a working fluid contained in the inner chamber, and
    a wick layer positioned in the inner chamber and configured to receive the working fluid; and
  mounting the heat spreader on the substrate by a monolithic attachment frame, the attachment frame extending continuously for 360 degrees around the lid, a cross-section of the attachment frame including a first member and a second member transverse to the first member, the first member engaging the lid from above, the second member secured to the substrate.

15. The method of claim 14, wherein
  the lid comprises copper, and
  the attachment frame comprises copper tungsten (CuW) or aluminum-silicon-carbide (AlSiC).

16. The method of claim 14, wherein the mounting further comprises securing the first member to the lid by at least one securing device, the at least one securing device free of direct contact with the substrate.

17. The method of claim 16, wherein the at least one securing device comprises solder or adhesive.

18. The method of claim 14, wherein the mounting further comprises securing the first member to the lid by rivets or screws extending through through-holes formed in the first member.

19. The method of claim 14, wherein the cross-section of the attachment frame is an L-shaped cross-section defined by the first and second members.

20. The method of claim 14, further comprising:
  securing a bottom surface of the second member to a top surface of the substrate by adhesive.

* * * * *